(12) United States Patent
Zhang et al.

(10) Patent No.: US 11,238,910 B2
(45) Date of Patent: Feb. 1, 2022

(54) CONTROL SIGNAL GENERATOR AND DRIVING METHOD THEREOF

(71) Applicant: BOE TECHNOLOGY GROUP CO., LTD., Beijing (CN)

(72) Inventors: Junrui Zhang, Beijing (CN); Xuehui Zhu, Beijing (CN); Ronghua Lan, Beijing (CN); Zongze He, Beijing (CN); Yehao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 11 days.

(21) Appl. No.: 16/834,667

(22) Filed: Mar. 30, 2020

(65) Prior Publication Data

US 2021/0125647 A1   Apr. 29, 2021

(30) Foreign Application Priority Data

Oct. 28, 2019 (CN) .......................... 201911031156.5

(51) Int. Cl.
*G11C 8/00* (2006.01)
*G11C 7/22* (2006.01)
*G11C 7/10* (2006.01)

(52) U.S. Cl.
CPC .............. *G11C 7/222* (2013.01); *G11C 7/106* (2013.01); *G11C 7/109* (2013.01); *G11C 7/1063* (2013.01); *G11C 7/1066* (2013.01); *G11C 7/1087* (2013.01); *G11C 7/1093* (2013.01)

(58) Field of Classification Search
CPC ....... G11C 7/222; G11C 7/106; G11C 7/1063; G11C 7/1087; G11C 7/109
See application file for complete search history.

(56) References Cited

U.S. PATENT DOCUMENTS

| | | | |
|---|---|---|---|
| 2009/0199036 A1* | 8/2009 | Warnock | G01R 31/318594 713/501 |
| 2014/0101501 A1* | 4/2014 | Devta Prasanna | G01R 31/318544 714/727 |
| 2015/0326211 A1* | 11/2015 | Hoshino | H03K 3/0315 318/503 |
| 2017/0272064 A1* | 9/2017 | Choi | G11C 7/02 |
| 2017/0294236 A1* | 10/2017 | Kang | G11C 11/4096 |
| 2019/0373200 A1* | 12/2019 | Yeh | H04N 5/3765 |
| 2020/0275045 A1* | 8/2020 | Higashi | H04N 5/378 |

* cited by examiner

*Primary Examiner* — Toan K Le
(74) *Attorney, Agent, or Firm* — Westman, Champlin & Koehler, P.A.

(57) ABSTRACT

A signal generator includes N stages of cascaded control signal generating circuits, and is configured to receive K clock signals whose valid pulse edges are different from each other by a set time, an n-th control signal generating circuit of the N stages of control signal generating circuit generates a strobe signal based on a k-th clock signal of the K clock signals and sequentially outputs at least two different clock signals of other K−1 clock signals based on the strobe signal. A valid pulse edge of the k-th clock signal is within a valid pulse duration of a strobe signal of an (n−1)-th stage control signal generating circuit.

10 Claims, 9 Drawing Sheets

CONTROL SIGNAL GENERATOR AND DRIVING METHOD THEREOF

CROSS-REFERENCE TO RELATED APPLICATION(S)

The present disclosure claims priority to Chinese Patent Application No. 201911031156.5, filed on Oct. 28, 2019, and titled "Control signal generator and driving method thereof", the entire disclosure of which is incorporated herein by reference.

TECHNICAL FIELD

The present disclosure relates to the field of control technology, and more particularly, to a control signal generator and a driving method thereof.

BACKGROUND

A large number of control signals are often involved in the case of complex control. In order to implement the control function correctly, a certain timing relationship between the control signals is required. If there is an error in the timing between different control signals, or the pulse duration of the control signals does not meet set requirements, it may cause misoperation. Therefore, the accuracy of the timing and of the pulse duration of the control signals is particularly important.

SUMMARY

According to an aspect of the present disclosure, there is provided a control signal generator comprising N stages of cascaded control signal generating circuits and configured to receive K clock signals whose valid pulse edges are different from each other by a set time, wherein an n-th control signal generating circuit of the N stages of control signal generating circuit is configured to: generate a strobe signal based on a k-th clock signal of the K clock signals; and sequentially output at least two different clock signals of other K−1 clock signals of the K clock signals as control signals based on the strobe signal; wherein a valid pulse edge of the k-th clock signal is within a valid pulse duration of a strobe signal of an (n−1)-th stage control signal generating circuit; N is an integer greater than or equal to 1, n is greater than or equal to 1 and less than or equal to N, K is an integer greater than or equal to 3, and k is greater than or equal to 1 and less than or equal to K.

In some embodiments, the n-th stage control signal generating circuit comprises: a strobe sub-circuit having a first input terminal, a second input terminal and an output terminal, the first input terminal of the strobe sub-circuit being electrically connected to an output terminal of the strobe sub-circuit of the (n−1)-th stage control signal generating circuit, the second input terminal of the strobe sub-circuit being electrically connected to receive the k-th clock signal, and the output terminal of the strobe sub-circuit being electrically connected to first input terminals of at least two switching sub-circuits to provide the strobe signal; the at least two switching sub-circuits, each having a first input terminal and a second input terminal, the second input terminals of each of the at least two switching sub-circuits being electrically connected to receive different clock signals of the other K−1 clock signals; wherein the second input terminal of the strobe sub-circuit is also electrically connected to a second input terminal of a first switching sub-circuit of the at least two switching sub-circuits of the (n−1)-th stage control signal generating circuit, the first switching sub-circuit being a switching sub-circuit that outputs a control signal last of the at least two switching sub-circuits that sequentially output control signals.

In some embodiments, when N is greater than or equal to 3, the first input terminal of the strobe sub-circuit of a first stage control signal generating circuit is electrically connected to the output terminal of the strobe sub-circuit of an N-th stage control signal generating circuit.

In some embodiments, valid pulse edges of the K clock signals are sequentially different by 1/K clock signal period, and a duty cycle of each of the K clock signals is 1/K.

In some embodiments, the strobe sub-circuit comprises a latch, a data input terminal of the latch is used as the first input terminal of the strobe sub-circuit, and a clock input terminal of the latch is used as the second input terminal of the strobe sub-circuit.

In some embodiments, each of the at least two switching sub-circuits comprises: a transmission gate, a control terminal of the transmission gate being used as the first input terminal of the switching sub-circuit, and a data input terminal of the transmission gate being used as the second input terminal of the switching sub-circuit.

According to the second aspect of the present disclosure, there is provided a driving method for the control signal generator, comprising: applying K clock signals to the control signal generator; wherein the n-th stage control signal generating circuit generates the strobe signal of the n-th stage control signal generating circuit based on the k-th clock signal of the K clock signals and the strobe signal of the (n−1)-th stage control signal generating circuit; and sequentially outputs at least two different clock signals of the other K−1 clock signals as control signals based on the strobe signal of the n-th stage control signal generating circuit.

In some embodiments, a valid pulse edge of the k-th clock signal is within a valid pulse duration of the strobe signal of the (n−1)-th stage control signal generating circuit.

In some embodiments, in response to applying K clock signals whose valid pulse edges are different from each other by a set time to the control signal generator, an enable signal is also applied to a first stage control signal generating circuit, wherein a valid pulse edge of a clock signal based on which the first stage control signal generating circuit generates the strobe signal is within a valid pulse duration of the enable signal.

In some embodiments, valid pulse edges of the K clock signals are sequentially different by 1/K clock signal period, and a duty cycle of each of the K clock signals is 1/K.

BRIEF DESCRIPTION OF THE DRAWINGS

The above and other objects, features, and advantages of the embodiments of the present disclosure will be made clearer through the following description of the embodiments of the present disclosure with reference to the accompanying drawings.

It should be noted that the same elements are denoted by the same or similar reference numerals throughout the drawings. In the drawings.

DETAILED DESCRIPTION

Figure 1:
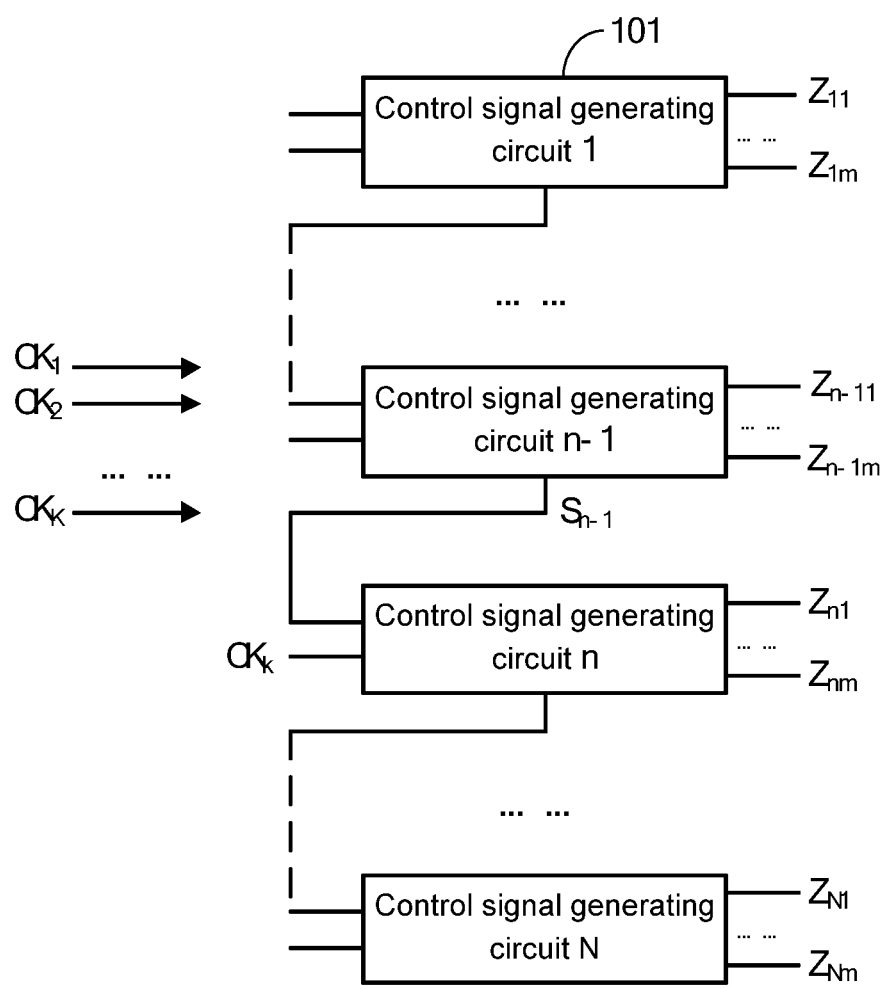
FIG. 1 schematically illustrates a block diagram of a control signal generator according to an embodiment of the present disclosure.

In order to make the purpose, technical solutions and advantages of the embodiments of the present disclosure more clear, the technical solutions in the embodiments of the present disclosure will be clearly and completely described below in conjunction with the drawings in the embodiments of the present disclosure. It is apparent that the described embodiments are part of the embodiments of the present disclosure, and not all the embodiments. All other embodiments obtained by a person of ordinary skill in the art based on the described embodiments of the present disclosure without creative effort should fall within the protection scope of the present disclosure. In the following description, some specific embodiments are for illustrative purposes only, and should not be understood as limiting the present disclosure, but are only examples of embodiments of the present disclosure. Conventional structures or configurations will be omitted if they may cause confusion to the understanding of the present disclosure. It should be noted that the shapes and sizes of the various components in the drawings do not reflect the true size and proportions, but merely illustrate the contents of the embodiments of the present disclosure.

Technical or scientific terms used in the embodiments of the present disclosure should be of ordinary meaning as understood by those skilled in the art, unless otherwise defined. The terms "first", "second" and similar words used in the embodiments of the present disclosure do not denote any order, quantity, or importance, but are merely used to distinguish different components.

Furthermore, in the description of the embodiments of the present disclosure, the term "connected to" or "connected" may mean that two components are directly connected, or that two components are connected via one or more other components. In addition, the two components may be connected or coupled in a wired or wireless manner.

In the description of the embodiments of the present disclosure, the term "valid pulse edge" refers to a pulse edge capable of triggering a related device to perform an operation based on the pulse edge. In some embodiments, the rising edge of the pulse signal may be used to trigger related devices to perform operations, and the rising edge of the pulse signal is the valid pulse edge. In other embodiments, the falling edge of the pulse signal may be used to trigger related devices to perform operations, and the falling edge of the pulse signal is the valid pulse edge.

In the description of the embodiments of the present disclosure, the term "valid level" refers to a level of a signal capable of causing a device that performs an operation based on a level to perform the operation. In some embodiments, the device may perform an operation based on a high level, and the high level is a valid level. In other embodiments, the valid level may be a low level.

Further, in the description of the embodiments of the present disclosure, the term "valid pulse duration" refers to a duration period of a valid level.

An embodiment of the present disclosure provides a control signal generator that can generate any number of control signals according to K input clock signals, where K is an integer greater than or equal to 3. Hereinafter, embodiments of the present disclosure will be described by taking a control signal generator that generates multiple scanning signals as an example. However, those skilled in the art may understand that the present disclosure is not limited thereto. For example, any desired control signal may be obtained by changing the timing, period, or duty cycle of the K input clock signals.

Multiple scanning signals are commonly used control signals, and may be applied to various application scenarios such as image display and data processing. The conventional method of generating multiple scanning signals is to use a counter to count the clock signals, and generate the required multiple scanning signals through a decoder. This usually requires a large number of combinational logic devices. With the increase of combinational logic devices, the timing requirements between devices will become very strict, and the redundancy of timing will become smaller and smaller. With the decrease of timing redundancy, the reliability of the circuit decreases, and this may lead to misoperation in some cases.

FIG. 1 schematically illustrates a block diagram of a control signal generator 100 according to an embodiment of the present disclosure. As shown in FIG. 1, the control signal generator 100 according to an embodiment of the present disclosure includes N stages of cascaded control signal generating circuits 101, which are represented in FIG. 1 as control signal generating circuit 1, . . . , control signal generating circuit n−1, control signal generating circuit n, . . . , and control signal generating circuit N, respectively, where N is an integer greater than or equal to 1.

As shown in FIG. 1, the control signal generator 100 may receive K clock signals whose valid pulse edges are different from each other by a set time, and which are denoted as $CK_1$, $CK_2$, . . . , and $CK_K$, respectively, where K is an integer greater than or equal to 3. The K clock signals may be provided via K clock signal lines.

The n-th stage control signal generating circuit in the N stages of cascaded control signal generating circuits according to an embodiment of the present disclosure may generate a strobe signal based on the k-th clock signal of the K clock signals, and sequentially output at least two different clock signals of the other K−1 clock signals of the K clock signals as the control signals output from the control signal generator 100 based on the generated strobe signal, where n and k are natural numbers, n is greater than or equal to 1 and less than or equal to N, and k is greater than or equal to 1 and less than or equal to K.

As shown in FIG. 1, an example is described in which each control signal generating circuit can output m control signals, where m is an integer greater than or equal to 2 and less than or equal to K−1. Of course, the embodiments of the present disclosure are not limited to this. Each stage of the control signal generating circuit may output the same number of control signals, or may output any number of signals in the range of 2 or more and K−1 or less.

As shown in FIG. 1, the m control signals output from the control signal generating circuit 1 are respectively denoted as $Z_{11}$ to $Z_{1m}$, and the m control signals output from the control signal generating circuit n are respectively denoted as $Z_{n1}$ to $Z_{nm}$, so the control signal generator consisting of N stages of cascaded control signal generating circuits can output N*m control signals. Thus, any number of control signals can be realized by changing the number of cascaded control signal generating circuits, and the value of N*m may be much larger than the value of K. According to the embodiment of the present disclosure, the control signal generating circuit of each stage has a simple structure, so that the volume of the control signal generator 100 constructed by cascading the control signal generating circuits is reduced and easily expanded.

According to an embodiment of the present disclosure, the valid pulse edge of the k-th clock signal input to the n-th stage control signal generating circuit is within the valid pulse duration of the strobe signal of the (n−1)-th stage control signal generating circuit.

As shown in FIG. 1, the k-th clock signal of the n-th stage control signal generating circuit is denoted as $CK_k$, and the strobe signal of the (n−1)-th stage control signal generating circuit is denoted as $S_{n-1}$. By connecting the (n−1)-th stage control signal generating circuit and the n-th control signal generating circuit in a cascade manner, electrically connecting the strobe signal $S_{n-1}$ to the input terminal of the n-th stage control signal generating circuit, and causing the valid pulse edge of the k-th clock signal $CK_k$ to be within the duration of the valid pulse of the strobe signal $S_{n-1}$, it is ensured that the strobe signal of the n-th stage control signal generating circuit is reliably generated, thereby providing sufficient timing redundancy for the control signal generator 100. This will be described in detail later with specific examples.

Figure 2:
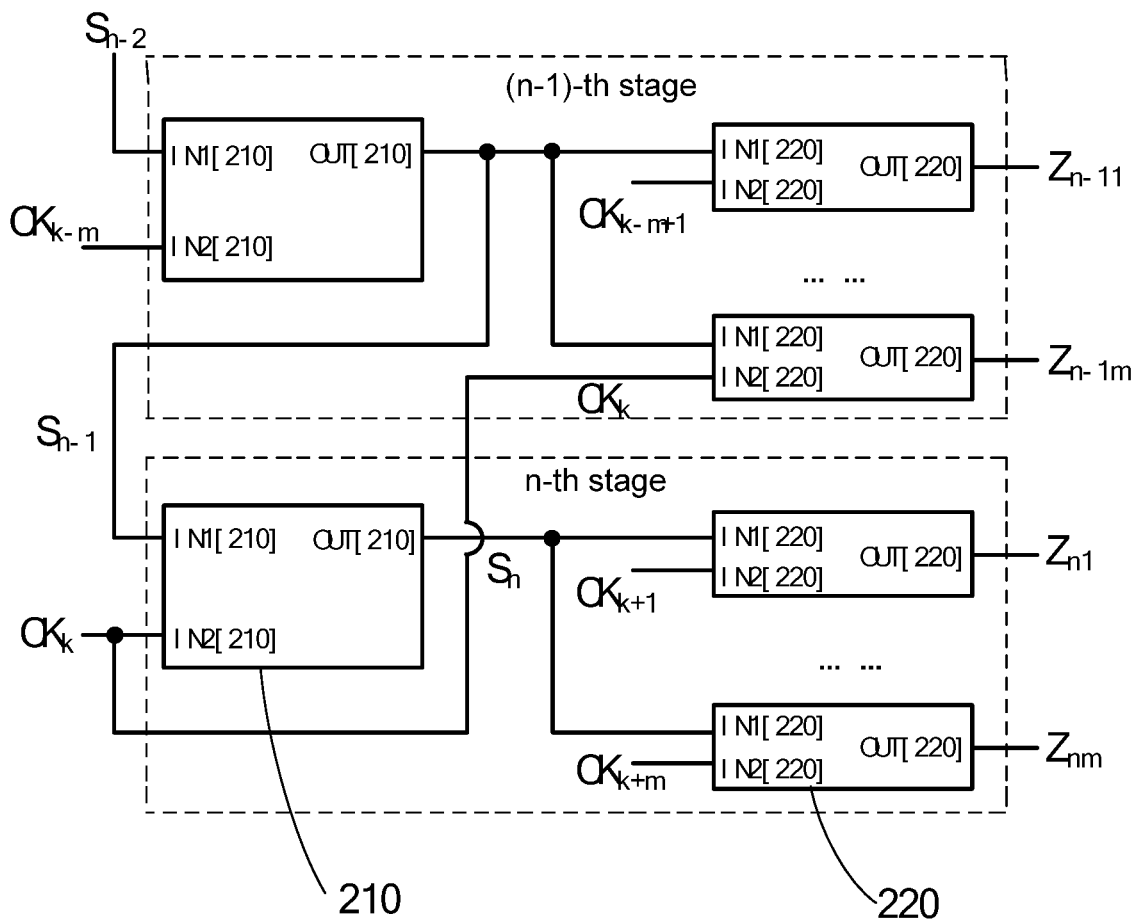
FIG. 2 schematically illustrates a block diagram of adjacent (n−1)-th and n-th stage control signal generating circuits according to an embodiment of the present disclosure.

FIG. 2 schematically illustrates a block diagram of adjacent (n−1)-th and n-th stage control signal generating circuits according to an embodiment of the present disclosure.

As shown in FIG. 2, each stage of the control signal generating circuit according to the embodiment of the present disclosure includes a strobe sub-circuit 210 and at least two switching sub-circuits 220. The strobe sub-circuit 210 includes a first input terminal IN1 [210], a second input terminal IN2 [210], and an output terminal OUT [210]. Take the n-th stage control signal generating circuit as an example. The first input terminal IN1 [210] of the strobe sub-circuit 210 of the n-th stage control signal generating circuit is electrically connected to the output terminal OUT [210] of the strobe sub-circuit 210 of the (n−1)-th stage control signal generating circuit, to receive the strobe signal $S_{n-1}$ of the (n−1)-th stage control signal generating circuit. The second input terminal IN2 [210] of the strobe sub-circuit 210 of the n-th stage control signal generating circuit is electrically connected to receive the k-th clock signal $CK_k$ of the K clock signals. The output terminal OUT [210] of the strobe sub-circuit 210 of the n-th stage control signal generating circuit is electrically connected to the first input terminals IN1 [220] of the at least two switching sub-circuits 220 of this n-th stage control signal generating circuit to provide the switching sub-circuits 220 with the strobe signal $S_n$ of the n-th stage control signal generating circuit.

As shown in FIG. 2, each switching sub-circuit 220 has a first input terminal IN1 [220], a second input terminal IN2 [220], and an output terminal OUT [220]. Take the n-th stage control signal generating circuit as an example. The second input terminal IN2 [220] of each switching sub-circuit 210 is electrically connected to receive a clock signal of the k−1 clock signals other than the k-th clock signal $CK_k$. In this embodiment, the n-th stage control signal generating circuit includes m switching sub-circuits 220, and the second input terminal IN2 [220] of each switching sub-circuit 220 receives a clock signal, which is denoted as $CK_{k+1}, \ldots, CK_{k+m}$, respectively. Each switching sub-circuit 220 outputs a control signal, which is denoted as $Z_{n1}$ to $Z_{nm}$, respectively. As shown in FIG. 2, the output terminal OUT [210] of the strobe sub-circuit 210 is electrically connected to the first input terminals IN1 [220] of all the m switching sub-circuits 220, so that the m switching sub-circuits 220 can be turned on at the same time.

According to an embodiment of the present disclosure, the second input terminal IN2 [210] of the strobe sub-circuit 210 of the n-th stage control signal generating circuit is also electrically connected to the second input terminal IN2 [220] of one (that is, a first switching sub-circuit) of the at least two switching sub-circuits 220 of the (n−1)-th stage control signal generating circuit. The one switching sub-circuit 220 (that is, the first switching sub-circuit) of the (n−1)-th stage control signal generating circuit is a switching sub-circuit that outputs a control signal last of the at least two switching sub-circuits of the (n−1)-th stage control signal generating circuit that output control signals sequentially.

As shown in FIG. 2, the second input terminal IN2 [210] of the strobe sub-circuit 210 of the n-th stage control signal generating circuit and the second input terminal IN2 [220] of the m-th switching sub-circuit 220 of the (n−1)-th stage control signal generating circuit are electrically connected together. This structure ensures that the valid pulse edge of the k-th clock signal $CK_k$ can be reliably within the valid pulse duration of the strobe signal $S_{n-1}$ of the (n−1)-th stage control signal generating circuit.

It should be noted that the "last output" does not mean the structural position, but the sequence in which all the switching sub-circuits output control signals during the valid pulse duration of the strobe signal $S_{n-1}$.

In some embodiments, the strobe sub-circuit 210 may be composed of a latch. The data input terminal of the latch may be used as the first input terminal of the strobe sub-circuit 210, and the clock input terminal of the latch may be used as the second input terminal of the strobe sub-circuit 210. The following example will be described by using a D latch as the strobe sub-circuit 210, but the present disclosure is not limited thereto, and other circuit structures may be used as the strobe sub-circuit 210.

The operation process of the control signal generator will be described below with specific examples.

Figure 3A:
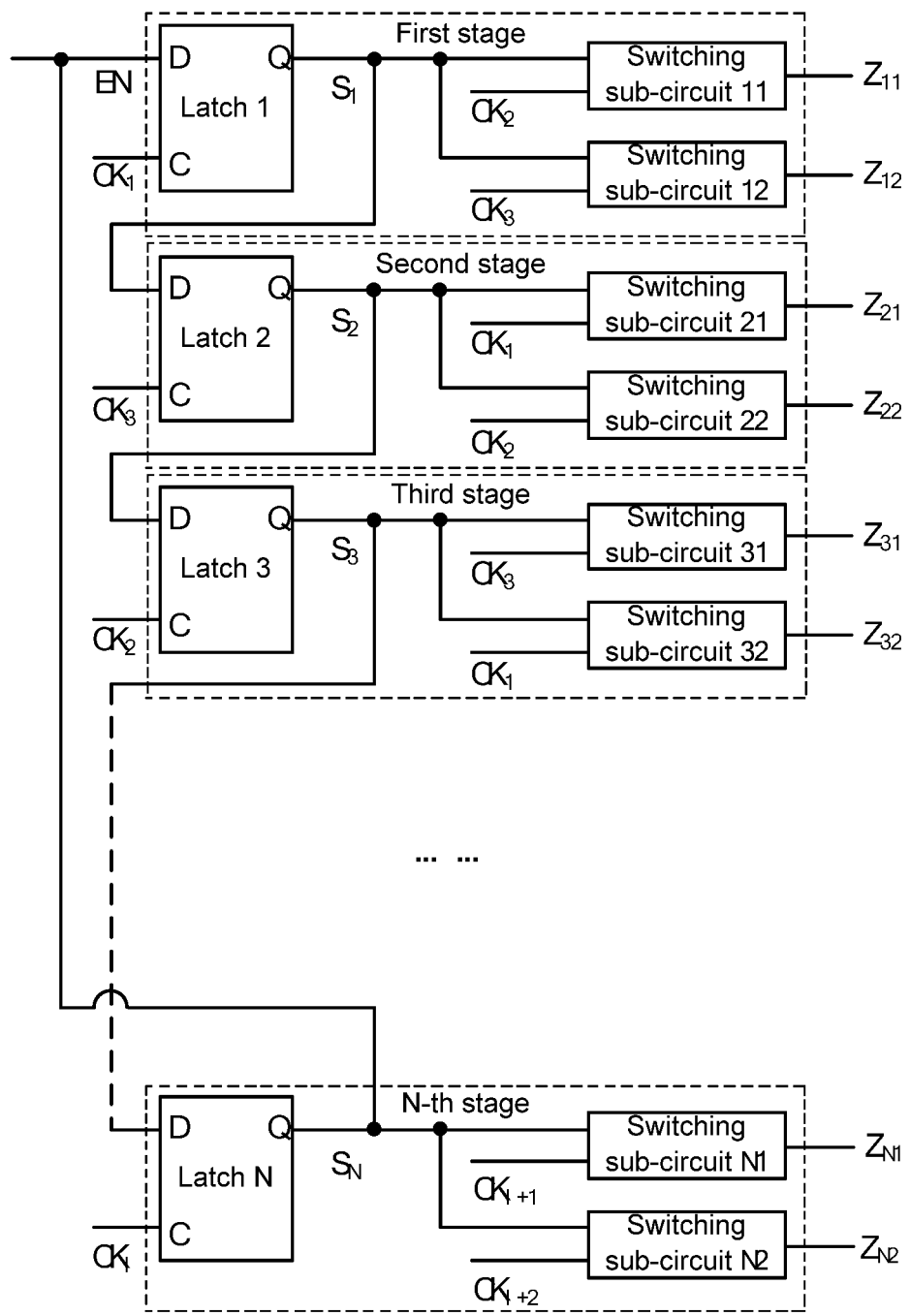
FIG. 3A schematically illustrates an example block diagram of a control signal generator having 3 clock signals.
Figure 3B:
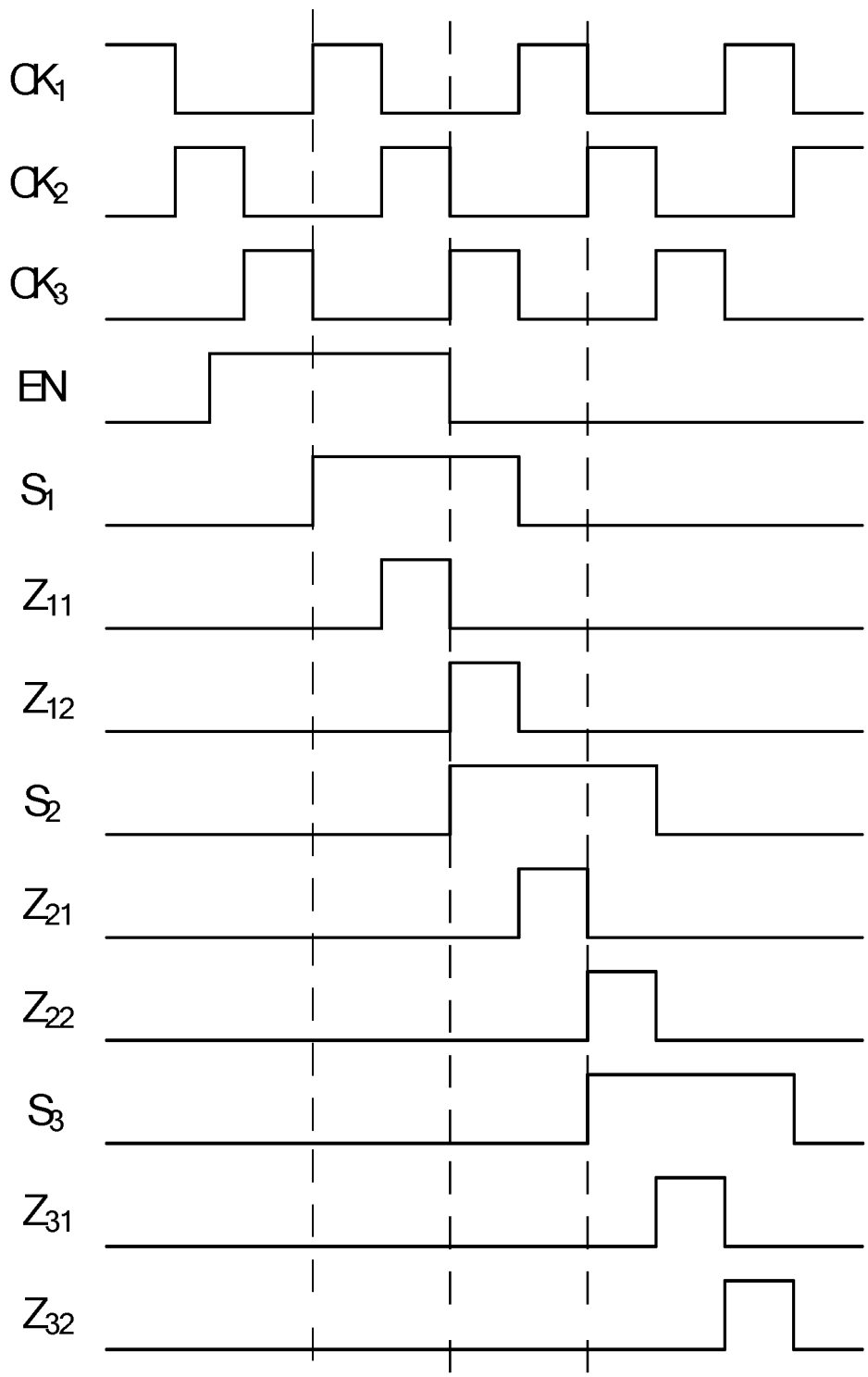
FIG. 3B schematically illustrates a timing diagram of the control signal generator shown in FIG. 3A.

FIG. 3A schematically illustrates an example block diagram of a control signal generator 300 having 3 clock signals, and FIG. 3B schematically illustrates a timing diagram of the control signal generator 300 shown in FIG. 3A.

As shown in FIG. 3A, each dashed block shows a stage of control signal generating circuit, and the case where N stages of control signal generating circuits are connected in a cascade manner is taken as an example. The control signal generator 300 receives three clock signals, $CK_1$, $CK_2$, and $CK_3$. The three clock signals have the same period and a duty cycle of ⅓, and the valid pulse edges (for example, rising edges) of $CK_1$, $CK_2$, and $CK_3$ are different from each other by ⅓ clock period.

The waveforms of the clock signals $CK_1$, $CK_2$, and $CK_3$ are shown in FIG. 3B. In one clock cycle, the valid pulse edges of the clock signal $CK_1$ and the clock signal $CK_2$ differ by ⅓ clock period, and the valid pulse edges of the clock signal $CK_2$ and the clock signal $CK_3$ differ by ⅓ clock period.

As shown in FIG. 3A, each stage of the control signal generating circuit in the control signal generator 300 may include one D latch and two switching sub-circuits. Taking the second stage control signal generating circuit as an example, the data input terminal of the D latch of the second stage control signal generating circuit is electrically connected to the output terminal of the D latch of the first stage control signal generating circuit. The clock input terminal of the D latch of the second stage control signal generating circuit is electrically connected to the second input terminal of the switching sub-circuit 12 of the first stage control signal generating circuit. The output terminal of the D latch of the second stage control signal generating circuit is electrically connected to the data input terminal of the D latch of the third stage control signal generating circuit, and the output terminal of the D latch of the second stage control signal generating circuit is also electrically connected to the first input terminal of the switching sub-circuit 21 and the first input terminal of the switching sub-circuit 22.

It should be understood that each of the clock signals $CK_1$, $CK_2$, and $CK_3$ may be provided through a clock signal line. The same clock signal at the input terminals of each D latch and each switching sub-circuit indicates that these input terminals are electrically connected together and are electrically connected to the same clock signal line.

According to this example, in a case where the data input terminal of the latch n of the n-th stage control signal generating circuit in the control signal generator 300 is electrically connected to receive the clock signal $CK_{k\ MOD\ K}$, the second input terminal of the switching sub-circuit n1 may be electrically connected to receive the clock signal $CK_{(k+1)\ MOD\ K}$, the second input terminal of the switching sub-circuit n2 may be electrically connected to receive the clock signal $CK_{(k+2)\ MOD\ K}$, and the clock input terminal of the latch n+1 of the (n+1)-th stage control signal generating circuit and the second input terminal of the switching sub-circuit n2 of the n-th stage control signal generating circuit are electrically connected together. "MOD" is a remainder operator, and K is the number of clock signals, that is, K=3.

As shown in FIG. 3A, in the first stage control signal generating circuit, the clock input terminal of the latch 1 is electrically connected to receive the clock signal $CK_1$, the second input terminal of the switching sub-circuit 11 is electrically connected to receive the clock signal $CK_2$, and the second input terminal of the switching sub-circuit 12 is electrically connected to receive the clock signal $CK_3$.

In the second stage control signal generating circuit, the clock input terminal of the latch 2 is electrically connected to receive the clock signal $CK_3$, the second input terminal of the switching sub-circuit 21 is electrically connected to receive the clock signal $CK_1$ ((3+1) MOD 3=1), and the second input terminal of the switching sub-circuit 22 is electrically connected to receive the clock signal $CK_2$ ((3+2) MOD 3=2).

In the third stage control signal generating circuit, the clock input terminal of the latch 3 is electrically connected to receive the clock signal $CK_2$, and the second input terminal of the switching sub-circuit 31 is electrically connected to receive the clock signal $CK_3$ ((2+1) MOD 3=3). It should be noted that the value of the subscript of the clock signal is 1, 2, or 3, so the result of (2+1) MOD 3 is recorded as 3 instead of 0. The second input terminal of the switching sub-circuit 32 is electrically connected to receive the clock signal $CK_1$ ((2+2) MOD 3=1).

In FIG. 3A, the clock input terminal of the latch N in the N-th stage control signal generating circuit is electrically connected to receive the clock signal $CK_I$, and $CK_I$ (and $CK_{I+1}$ and $CK_{I+2}$) may be one of $CK_1$, $CK_2$, and $CK_3$. It is determined by the number of cascaded control signal generating circuits.

For the operation timing of the control signal generator 300, refer to FIG. 3B.

As shown in FIG. 3B, an enable signal EN is firstly applied to the data input terminal of the D latch of the first stage control signal generating circuit. The valid pulse duration of the enable signal EN is required to ensure that the valid pulse edge of the first clock signal $CK_1$ is within the valid pulse duration of the enable signal EN to ensure that the latch 1 operates reliably.

When the enable signal EN is at a valid level (for example, a high level), the latch 1 outputs a strobe signal $S_1$ under the effect of a valid pulse edge (for example, a rising edge) of the clock signal $CK_1$, and $S_1$ becomes a valid level (for example, a high level), as shown in FIG. 3B.

After the strobe signal $S_1$ becomes the high level, the switching sub-circuit 11 and the switching sub-circuit 12 are both turned on, so the clock signals $CK_2$ and $CK_3$ respectively applied to the switching sub-circuit 11 and the switching sub-circuit 12 may be sequentially output. As shown in FIG. 3B, while $S_1$ is at the high level, the clock signal $CK_2$ is output as the control signal $Z_{11}$ via the switching sub-circuit 11, and $CK_3$ is output as the control signal $Z_{12}$ via the switching sub-circuit 12.

While the strobe signal $S_1$ of the first stage control signal generating circuit remains at the high level, the latch 2 of the second stage control signal generating circuit is triggered by the valid pulse edge (for example, the rising edge) of the clock signal $CK_3$ and outputs the strobe signal $S_2$, and $S_2$ becomes a valid level (for example, a high level), as shown in FIG. 3B.

After the strobe signal $S_2$ becomes the high level, the switching sub-circuit 21 and the switching sub-circuit 22 are both turned on, so the clock signals $CK_1$ and $CK_2$ respectively applied to the switching sub-circuit 21 and the switching sub-circuit 22 may be sequentially output. As shown in FIG. 3B, while $S_2$ is at the high level, the clock signal $CK_1$ is output as the control signal $Z_{21}$ via the switching sub-circuit 21, and $CK_2$ is output as the control signal $Z_{22}$ via the switching sub-circuit 22.

While the strobe signal $S_2$ of the second stage control signal generating circuit remains at the high level, the latch 3 of the third stage control signal generating circuit outputs the strobe signal $S_3$ under the effect of the valid pulse edge (for example, the rising edge) of the clock signal $CK_2$, and $S_3$ becomes a valid level (for example, a high level), as shown in FIG. 3B.

After the strobe signal $S_3$ becomes the high level, the switching sub-circuit 31 and the switching sub-circuit 32 are both turned on, so the clock signals $CK_3$ and $CK_1$ respectively applied to the switching sub-circuit 31 and the switching sub-circuit 32 may be sequentially output. As shown in FIG. 3B, while $S_3$ is at the high level, the clock signal $CK_3$ is output as the control signal $Z_{31}$ via the switching sub-circuit 31, and $CK_1$ is output as the control signal $Z_{32}$ via the switching sub-circuit 32.

According to the examples shown in FIG. 3A and FIG. 3B, by using only three clock signals and using a small number of devices, any number of control signals can be generated, which significantly simplifies the structure of the control signal generator.

Devices that perform operations based on pulse edges are prone to competing risks. For example, when the valid pulse edge of the clock signal received at the clock input terminal of the D latch is very close to the pulse edge of the signal received at its data input terminal, the action of the D latch will no longer be reliable, and a misoperation is likely to occur.

As shown in FIG. 3B, according to this example, the valid pulse edge of the clock signal $CK_3$ of the latch 2 is within the valid pulse duration of the strobe signal $S_1$, and is kept at ⅓ clock period (that is, a duty cycle) from the end of the valid pulse duration of the strobe signal $S_1$, that is, the arrival of the falling edge of $S_1$. Such a time margin can ensure that the latch 2 operates reliably. Similarly, the valid pulse edge of the clock signal $CK_2$ of the latch 3 is within the valid pulse duration of the strobe signal $S_2$, and is kept at ⅓ clock period (that is, a duty cycle) from the arrival of the falling edge of the strobe signal $S_2$, thereby ensuring that the latch 3 operates reliably. Therefore, the control signal generator 300 may have better timing redundancy.

In addition, as shown in FIG. 3A, when the number of cascaded control signal generating circuits is three or more, the output terminal of the strobe sub-circuit (that is, latch N) of the last stage control signal generating circuit may be electrically connected to the first input terminal of the strobe sub-circuit (that is, latch 1) of the first stage control signal generating circuit. In this way, the strobe signal $S_N$ is applied to the data input terminal of the latch 1, so that a cyclic structure is formed, which is particularly suitable for a cyclic processing structure, such as image display.

Figure 4A:
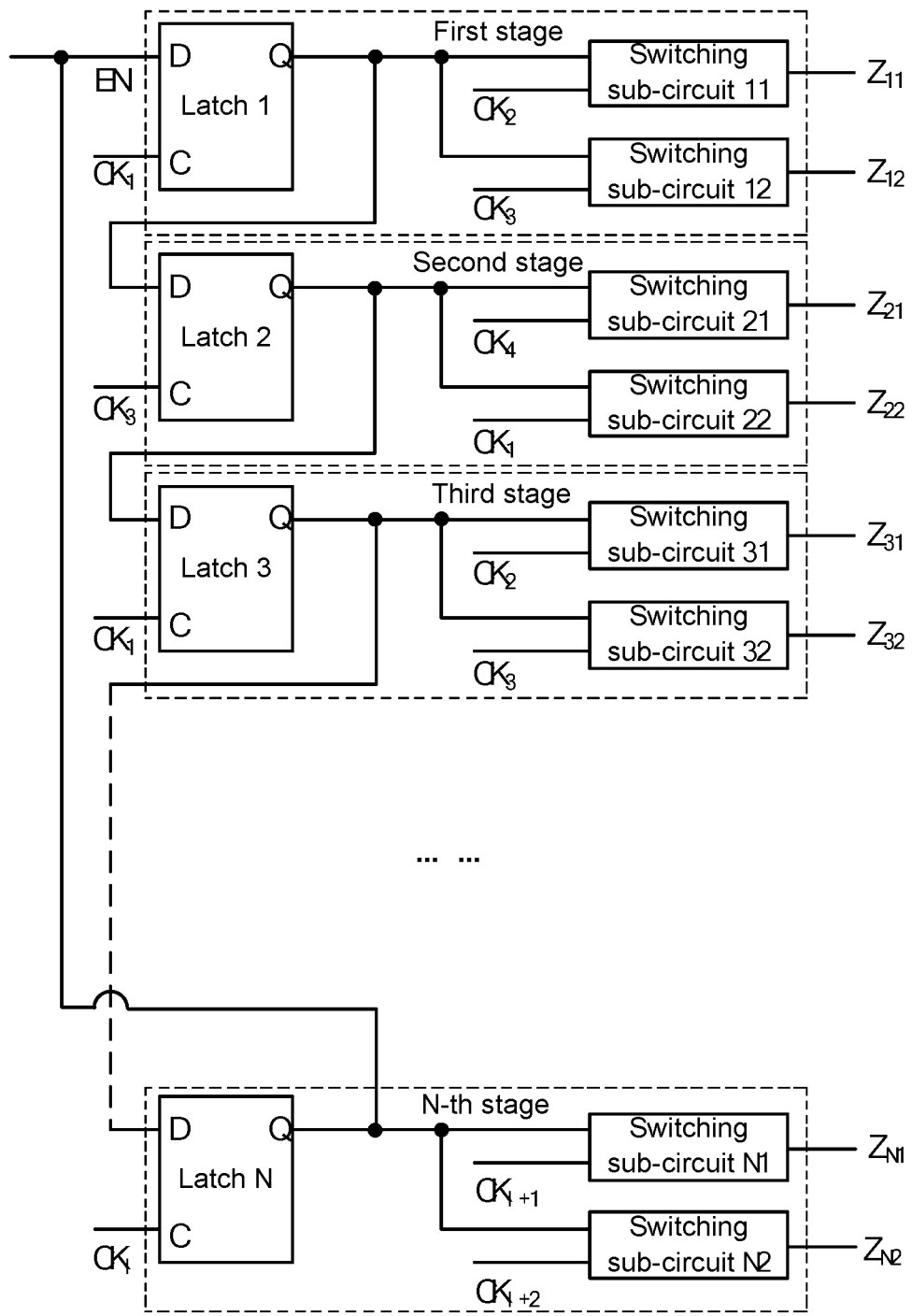
FIG. 4A and FIG. 5A schematically illustrate block diagrams of control signal generators having 4 clock signals.
Figure 4B:
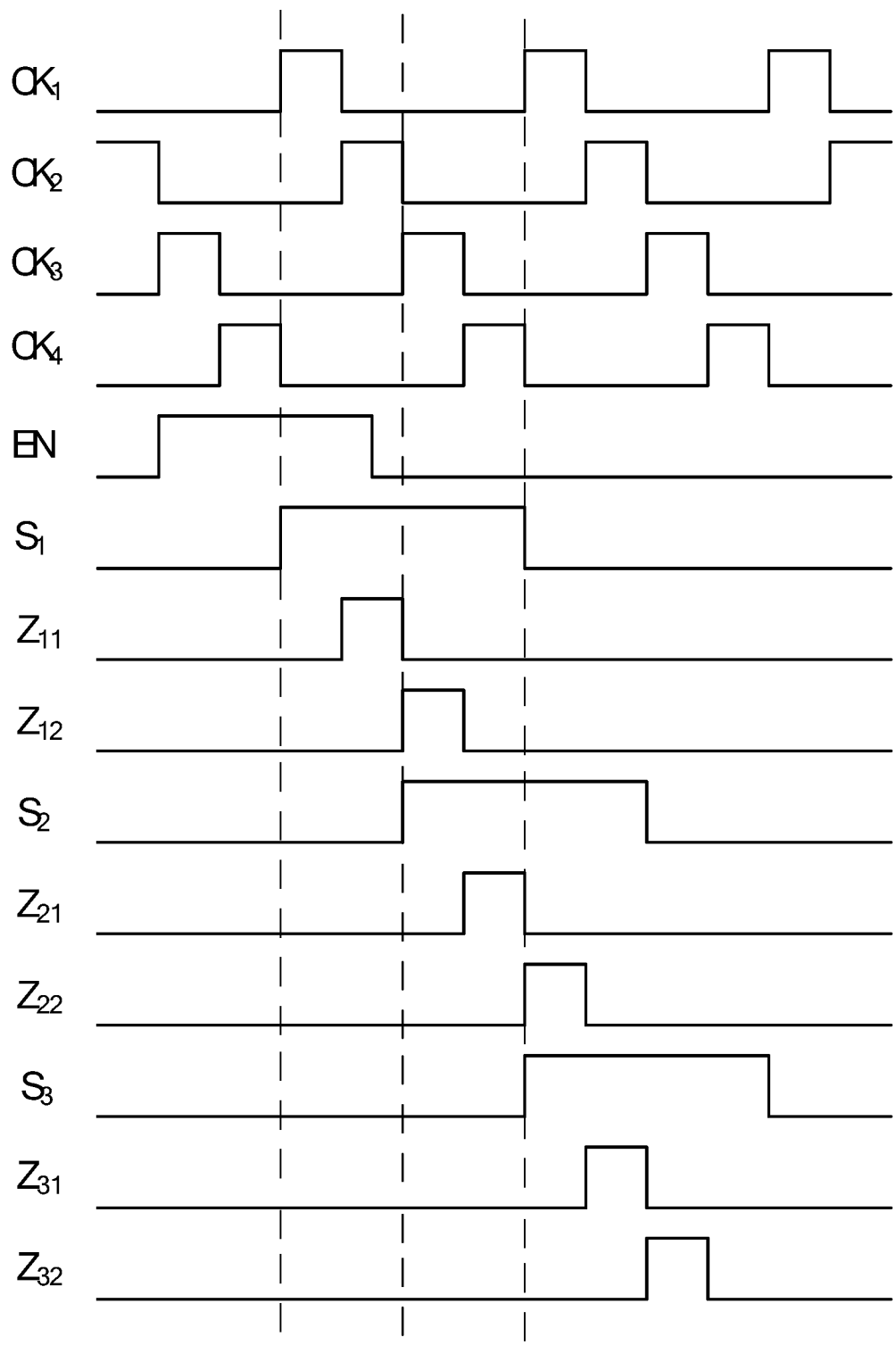
FIG. 4B and FIG. 5B schematically illustrate timing diagrams of the control signal generators shown in FIG. 4A and FIG. 5A.

FIG. 4A schematically illustrates an example block diagram of a control signal generator 400 having 4 clock signals, and FIG. 4B schematically illustrates a timing diagram of the control signal generator 400 shown in FIG. 4A.

As shown in FIG. 4A, the control signal generator 400 receives four clock signals $CK_1$, $CK_2$, $CK_3$, and $CK_4$. The four clock signals have the same period and a duty cycle of ¼, and the valid pulse edges (for example, rising edges) of $CK_1$, $CK_2$, $CK_3$, and $CK_4$ are different from each other by ¼ clock period. The waveforms of the clock signals $CK_1$, $CK_2$, $CK_3$, and $CK_4$ are shown in FIG. 4B.

As shown in FIG. 4A, each stage of the control signal generating circuit in the control signal generator 400 includes one D latch and two switching sub-circuits. Taking the second stage control signal generating circuit as an example, the data input terminal of the D latch of the second stage control signal generating circuit is electrically connected to the output terminal of the D latch of the first stage control signal generating circuit. The clock input terminal of the D latch of the second stage control signal generating circuit is electrically connected to the second input terminal of the switching sub-circuit 12 of the first stage control signal generating circuit. The output terminal of the D latch of the second stage control signal generating circuit is electrically connected to the data input terminal of the D latch of the third stage control signal generating circuit, and the output terminal of the D latch of the second stage control signal generating circuit is also electrically connected to the first input terminal of the switching sub-circuit 21 and the first input terminal of the switching sub-circuit 22.

It should be understood that each of the clock signals $CK_1$, $CK_2$, $CK_3$, and $CK_4$ may be provided through a clock signal line. The same clock signal at the input terminals of each D latch and each switching sub-circuit indicates that these input terminals are electrically connected together and are electrically connected to the same clock signal line.

According to this example, in a case where the data input terminal of the latch n of the n-th stage control signal generating circuit in the control signal generator 400 is electrically connected to receive the clock signal $CK_{k\ MOD\ K}$, the second input terminal of the switching sub-circuit n1 may be electrically connected to receive the clock signal $CK_{(k+1)\ MOD\ K}$, the second input terminal of the switching sub-circuit n2 may be electrically connected to receive the clock signal $CK_{(k+2)\ MOD\ K}$, and the clock input terminal of the latch n+1 of the (n+1)-th stage control signal generating circuit and the second input terminal of the switching sub-circuit n2 of the n-th stage control signal generating circuit are electrically connected together. "MOD" is a remainder operator, and K is the number of clock signals, that is, K=4.

As shown in FIG. 4A, in the first stage control signal generating circuit, the clock input terminal of the latch 1 is electrically connected to receive the clock signal $CK_1$, the second input terminal of the switching sub-circuit 11 is electrically connected to receive the clock signal $CK_2$, and the second input terminal of the switching sub-circuit 12 is electrically connected to receive the clock signal $CK_3$.

In the second stage control signal generating circuit, the clock input terminal of the latch 2 is electrically connected to receive the clock signal $CK_3$, and the second input terminal of the switching sub-circuit 21 is electrically connected to receive $CK_4$ ((3+1) MOD 4=4). The value of the subscript of the clock signal is 1, 2, 3, or 4, so the result of (3+1) MOD 4 is recorded as 4 instead of 0. The second input terminal of the switching sub-circuit 22 is electrically connected to receive the clock signal $CK_1$ ((3+2) MOD 4=1).

Similarly, the clock signal $CK_I$ (and $CK_{I+1}$ and $CK_{I+2}$) of the N-th stage control signal generating circuit in FIG. 4A may be one of $CK_1$, $CK_2$, $CK_3$, and $CK_4$. It is determined by the number of cascaded control signal generating circuits.

In the third stage control signal generating circuit, the clock input terminal of the latch 3 is electrically connected to receive the clock signal $CK_1$, therefore, the structure of the third stage control signal generating circuit is the same as that of the first stage control signal generating circuit. Similarly, the structure of the fourth stage control signal generating circuit is the same as that of the second stage control signal generating circuit, and so on.

For the operation timing of the control signal generator 400, refer to FIG. 4B.

As shown in FIG. 4B, first, an enable signal EN is applied to the data input terminal of the D latch of the first stage control signal generating circuit. The valid pulse duration of the enable signal EN should ensure that the valid pulse edge of the first clock signal $CK_1$ is within the valid pulse duration of the enable signal EN to ensure that the latch 1 operates reliably.

When the enable signal EN is at a valid level (for example, a high level), the latch 1 outputs a strobe signal $S_1$ under the effect of a valid pulse edge (for example, a rising edge) of the clock signal $CK_1$, and $S_1$ becomes a valid level (for example, a high level), as shown in FIG. 4B.

After the strobe signal $S_1$ becomes the high level, the switching sub-circuit 11 and the switching sub-circuit 12 are both turned on, so the clock signals $CK_2$ and $CK_3$ respectively applied to the switching sub-circuit 11 and the switching sub-circuit 12 may be sequentially output. As shown in FIG. 4B, while $S_1$ is at the high level, the clock signal $CK_2$ is output as the control signal $Z_{11}$ via the switching sub-circuit 11, and $CK_3$ is output as the control signal $Z_{12}$ via the switching sub-circuit 12.

While the strobe signal $S_1$ of the first stage control signal generating circuit remains at the high level, the latch 2 of the second stage control signal generating circuit is effected by the valid pulse edge (for example, the rising edge) of the clock signal $CK_3$ and outputs the strobe signal $S_2$, and $S_2$ becomes a valid level (for example, a high level), as shown in FIG. 4B.

After the strobe signal $S_2$ becomes the high level, the switching sub-circuit 21 and the switching sub-circuit 22 are both turned on, so the clock signals $CK_4$ and $CK_1$ respectively applied to the switching sub-circuit 21 and the switching sub-circuit 22 may be sequentially output. As shown in FIG. 4B, while $S_2$ is at the high level, the clock signal $CK_4$ is output as the control signal $Z_{21}$ via the switching sub-circuit 21, and $CK_1$ is output as the control signal $Z_{22}$ via the switching sub-circuit 22.

As shown in FIG. 4B, according to this example, the valid pulse edge of the clock signal $CK_3$ of the latch 2 is within the valid pulse duration of the strobe signal $S_1$, and is kept at ½ clock period from the end of the valid pulse duration of the strobe signal $S_1$, that is, the arrival of the falling edge of $S_1$. Such a time margin can ensure that the latch 2 operates reliably. Similarly, the valid pulse edge of the clock signal $CK_1$ of the latch 3 is within the valid pulse duration of the strobe signal $S_2$, and is kept at ½ clock period from the arrival of the falling edge of the strobe signal $S_2$, thereby ensuring that the latch 3 operates reliably. Therefore, the control signal generator 400 may have improved timing redundancy.

It can be seen that compared with the examples shown in FIG. 3A and FIG. 3B, the timing redundancy of the examples shown in FIG. 4A and FIG. 4B is improved, and the control signal generator 400 can operate more reliably.

Similarly, as shown in FIG. 4A, when the number of cascaded control signal generating circuits is three or more, the output terminal of the latch N of the last stage control signal generating circuit may be electrically connected to the first input terminal of the latch 1 of the first stage control signal generating circuit to form a cyclic structure.

Figure 5A:
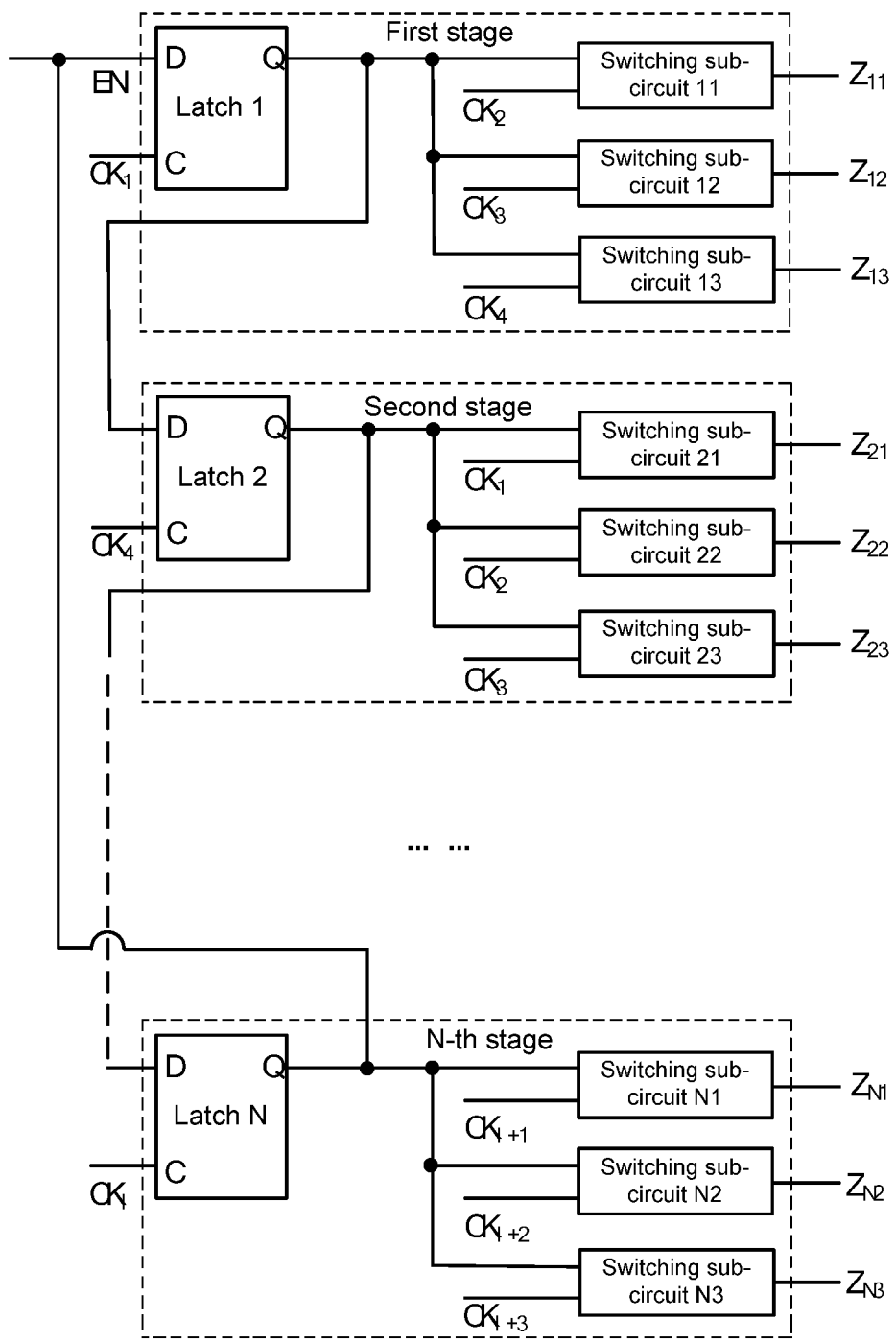
Figure 5B:
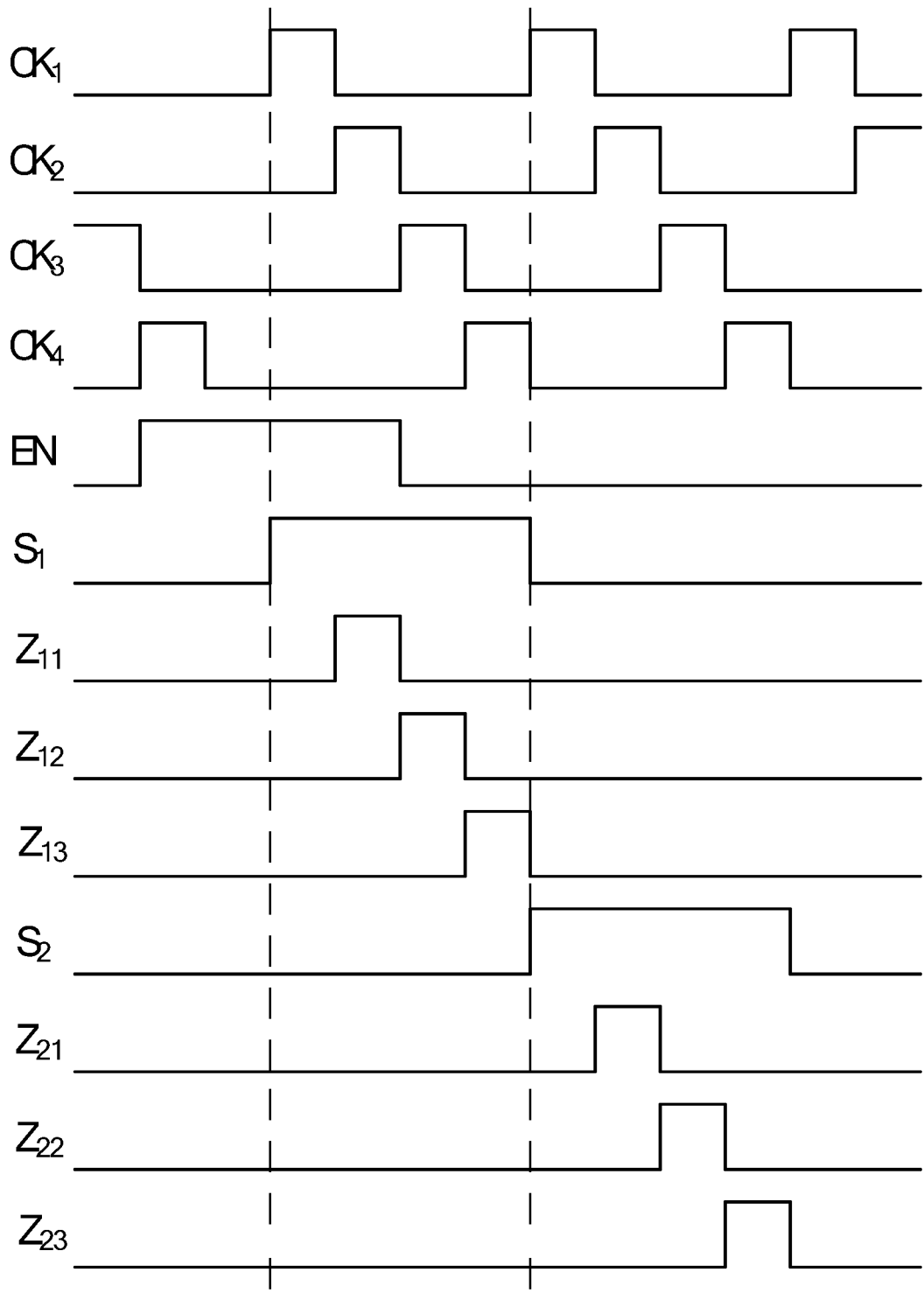

FIG. 5A schematically illustrates another example block diagram of a control signal generator 500 having 4 clock signals, and FIG. 5B schematically illustrates a timing diagram of the control signal generator 500 shown in FIG. 5A.

As shown in FIG. 5A, each stage of the control signal generating circuit in the control signal generator 500 includes one D latch and three switching sub-circuits. Taking the second stage control signal generating circuit as an example, the data input terminal of the D latch of the second stage control signal generating circuit is electrically connected to the output terminal of the D latch of the first stage control signal generating circuit. The clock input terminal of the D latch of the second stage control signal generating circuit is electrically connected to the second input terminal of the switching sub-circuit 13 of the first stage control signal generating circuit. The output terminal of the D latch of the second stage control signal generating circuit is electrically connected to the data input terminal of the D latch of the third stage control signal generating circuit, and the output terminal of the D latch of the second stage control signal generating circuit is also electrically connected to the first input terminal of the switching sub-circuit 21, the first input terminal of the switching sub-circuit 22 and the first input terminal of the switching sub-circuit 23.

According to this example, in a case where the data input terminal of the latch n of the n-th stage control signal generating circuit in the control signal generator 500 is electrically connected to receive the clock signal $CK_{k\ MOD\ K}$, the second input terminal of the switching sub-circuit n1 may be electrically connected to receive the clock signal $CK_{(k+1)\ MOD\ K}$, the second input terminal of the switching sub-circuit n2 may be electrically connected to receive the clock signal $CK_{(k+2)\ MOD\ K}$, the second input terminal of the switching sub-circuit n3 may be electrically connected to receive $CK_{(k+3)\ MOD\ K}$, and the clock input terminal of the latch n+1 of the (n+1)-th stage control signal generating circuit and the second input terminal of the switching sub-circuit n3 of the n-th stage control signal generating circuit are electrically connected together. "MOD" is a remainder operator, and K is the number of clock signals, that is, K=4.

As shown in FIG. 5A, in the first stage control signal generating circuit, the clock input terminal of the latch 1 is electrically connected to receive the clock signal $CK_1$, the second input terminal of the switching sub-circuit 11 is electrically connected to receive the clock signal $CK_2$, the second input terminal of the switching sub-circuit 12 is electrically connected to receive the clock signal $CK_3$, and the second input terminal of the switching sub-circuit 13 is electrically connected to receive the clock signal $CK_4$.

In the second stage control signal generating circuit, the clock input terminal of the latch 2 is electrically connected to receive the clock signal $CK_4$, the second input terminal of the switching sub-circuit 21 is electrically connected to receive the clock signal $CK_1$ ((4+1) MOD 4=1), the second input terminal of the switching sub-circuit 22 is electrically connected to receive the clock signal $CK_2$ ((4+2) MOD 4=2), and the second input terminal of the switching sub-circuit 23 is electrically connected to receive the clock signal $CK_3$ ((4+3) MOD 4=3).

Similarly, the clock signal $CK_I$ (and $CK_{I+1}$, $CK_{I+2}$, and $CK_{I+3}$) of the N-th stage control signal generating circuit in FIG. 5A may be one of $CK_1$, $CK_2$, $CK_3$, and $CK_4$. It is determined by the number of cascaded control signal generating circuits.

For the operation timing of the control signal generator 500, refer to FIG. 5B. The main difference from the example shown in FIG. 4A and FIG. 4B is that after the strobe signal $S_1$ becomes the high level, the switching sub-circuit 11, the switching sub-circuit 12, and the switching sub-circuits 13 are all turned on, so the clock signals $CK_2$, $CK_3$, and $CK_4$ can be sequentially output. As shown in FIG. 5B, while $S_1$ is at the high level, the clock signal $CK_2$ is output as the control signal $Z_{11}$ via the switching sub-circuit 11, $CK_3$ is output as the control signal $Z_{12}$ via the switching sub-circuit 12, and $CK_4$ is output as the control signal $Z_{13}$ via the switching sub-circuit 13.

In addition, as shown in FIG. 5B, while the strobe signal $S_1$ of the first stage control signal generating circuit remains at the high level, the latch 2 of the second stage control signal generating circuit is effected by the valid pulse edge (for example, the rising edge) of the clock signal $CK_4$ and outputs the strobe signal $S_2$, and $S_2$ becomes a valid level (for example, a high level), as shown in FIG. 5B. In this way, the valid pulse edge of the clock signal of each stage of the control signal generating circuit can be kept at ¼ clock period (that is, a duty cycle) from the arrival of the falling edge of the strobe signal.

It can be seen that compared with the examples shown in FIG. 4A and FIG. 4B, the control signal generator 500 can output more control signals in each stage of the control signal generating circuit, but the time margin between the clock signal and the strobe signal decreases. In practical applications, the control signal generator 400 or the control signal generator 500 may be selected as required.

Figure 6:
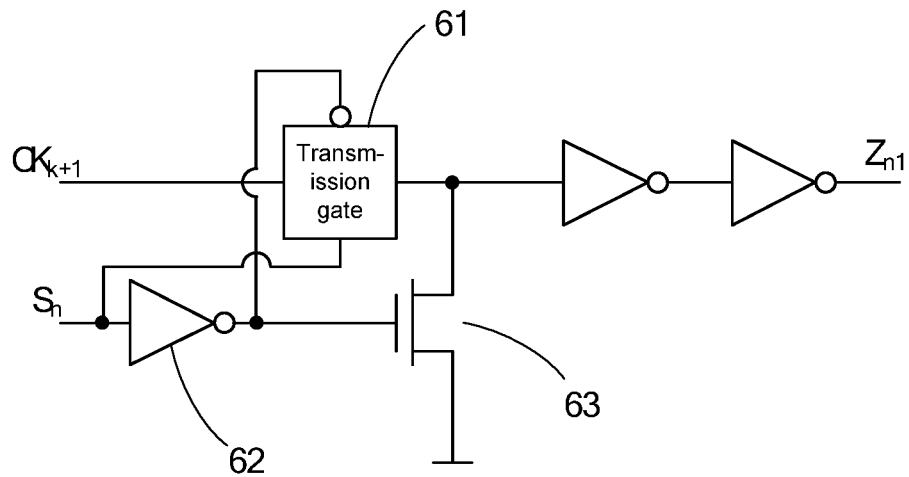
FIG. 6 schematically illustrates a circuit diagram of a switching sub-circuit according to an embodiment of the present disclosure.

FIG. 6 schematically illustrates a circuit diagram of a switching sub-circuit according to an embodiment of the present disclosure.

As shown in FIG. 6, taking the first switching sub-circuit of the n-th stage control signal generating circuit as an example, the switching sub-circuit includes a transmission gate 61. The control terminal of the transmission gate 61 is used as the first input terminal of the switching sub-circuit. The data input terminal of the transmission gate 61 is used as the second input terminal of the switching sub-circuit. The output terminal of the transmission gate 61 is used as the output terminal of the switching sub-circuit. As shown in FIG. 6, the switching sub-circuit may further include a first inverter 62 and a transistor 63. The strobe signal $S_n$ of the n-th stage control signal generating circuit and an inverted signal of the strobe signal $S_n$ output via the first inverter 62 are electrically connected to two control terminals of the transmission gate 61, respectively. In FIG. 6, two inverters connected in series are further electrically connected to the output terminal of the transmission gate 61, the purpose of which is to increase the load capacity of the transmission gate. A control signal $Z_{n1}$ is output at the output terminal of the inverters connected in series. When the strobe signal $S_n$ is at a high level, the transmission gate 61 is turned on, and the clock signal $CK_{k+1}$ is output as the control signal $Z_{n1}$ via the transmission gate and two inverters connected in series.

The switching sub-circuit shown in FIG. 6 is only an example, and the present disclosure is not limited thereto.

Figure 7:
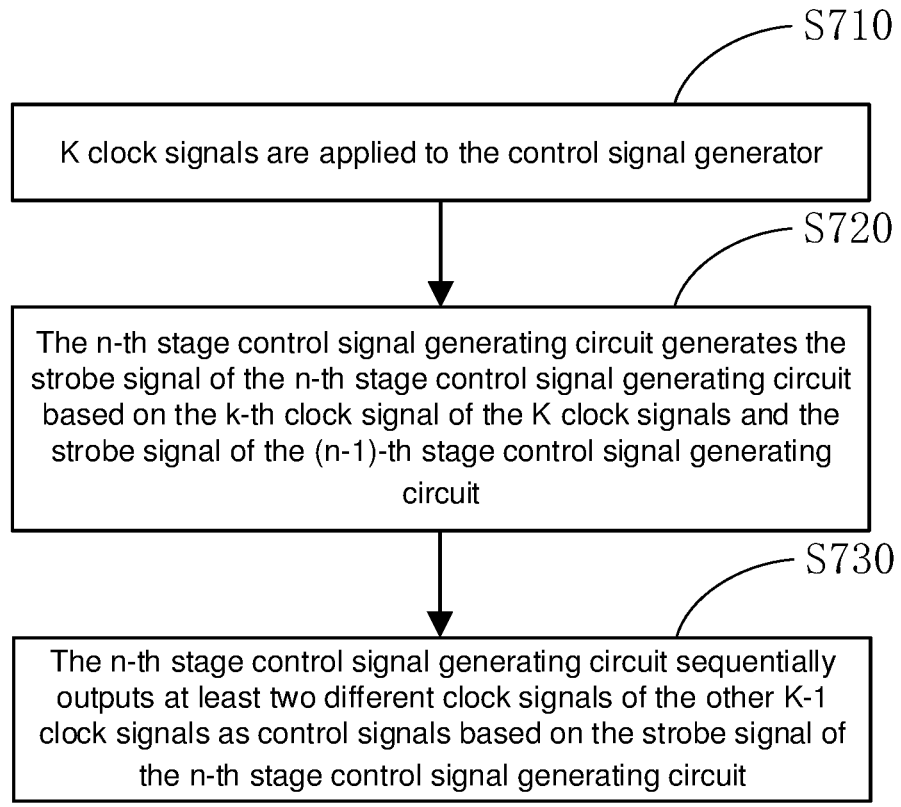
FIG. 7 schematically illustrates a flowchart of a driving method of a control signal generator according to an embodiment of the present disclosure.

FIG. 7 schematically illustrates a flowchart of a driving method of a control signal generator according to an embodiment of the present disclosure.

As shown in FIG. 7, the driving method includes the following steps.

In step S710, K clock signals whose valid pulse edges are different from each other by a set time are applied to the control signal generator.

In step S720, the n-th stage control signal generating circuit generates the strobe signal of the n-th stage control signal generating circuit based on the k-th clock signal of the K clock signals and the strobe signal of the (n−1)-th stage control signal generating circuit.

In step S730, the n-th stage control signal generating circuit sequentially outputs at least two different clock signals of the other K−1 clock signals as control signals based on the strobe signal of the n-th stage control signal generating circuit.

According to an embodiment of the present disclosure, in response to applying K clock signals whose valid pulse edges are different from each other by a set time to the control signal generator, an enable signal is also applied to a first stage control signal generating circuit to start the control signal generator, wherein a valid pulse edge of a clock signal based on which the first stage control signal generating circuit generates the strobe signal is within a valid pulse duration of the enable signal.

In this driving method, a valid pulse edge of the k-th clock signal is within a valid pulse duration of the strobe signal of the (n−1)-th stage control signal generating circuit.

According to an embodiment of the present disclosure, the control signal generator is configured by cascading N control signal generating circuits, and realizes the generation of any number of control signals with a relatively small number of K clock signals. Compared with a control signal generator using a counter and decoder structure, the circuit structure can be simplified, and the volume and power consumption of the circuit control signal generator can be effectively reduced.

According to an embodiment of the present disclosure, the strobe signal of the n-th stage control signal generating circuit is generated by using the k-th clock signal whose valid pulse edge is within the valid pulse duration of the strobe signal of the (n−1)-th stage control signal generating circuit, which makes the control signal generator have more sufficient timing redundancy, and improves the reliability of the control signal generator.

It should be noted that, in the above description, the technical solutions of the embodiments of the present disclosure are shown by way of example only, but it does not mean that the embodiments of the present disclosure are limited to the above steps and structures. Where possible, steps and structures may be adjusted and selected as needed. Therefore, certain steps and units are not necessary to implement the general inventive concept of the embodiments of the present disclosure.

The disclosure has been described so far in connection with the preferred embodiments. It should be understood that those skilled in the art can make various changes, substitutions, and additions without departing from the spirit and scope of the embodiments of the present disclosure. Therefore, the scope of the embodiments of the present disclosure is not limited to the specific embodiments described above, but should be defined by the appended claims.

We claim:

1. A control signal generator comprising N stages of cascaded control signal generating circuits and configured to receive K clock signals whose valid pulse edges are different from each other by a set time, wherein an n-th control signal generating circuit of the N stages of control signal generating circuit is configured to:
    generate a strobe signal based on a k-th clock signal of the K clock signals; and
    sequentially output at least two different clock signals of other K−1 clock signals of the K clock signals as control signals based on the strobe signal;
    wherein a valid pulse edge of the k-th clock signal is within a valid pulse duration of a strobe signal of an (n−1)-th stage control signal generating circuit; N is an integer greater than or equal to 1, n is greater than or equal to 1 and less than or equal to N, K is an integer greater than or equal to 3, and k is greater than or equal to 1 and less than or equal to K; and
    wherein the strobe signal of the (n−1)-th stage control signal generating circuit is electrically connected to an input terminal the n-th stage control signal generating circuit.

2. The control signal generator according to claim 1, wherein the n-th stage control signal generating circuit comprises:
    a strobe sub-circuit having a first input terminal, a second input terminal and an output terminal, the first input terminal of the strobe sub-circuit being electrically connected to an output terminal of the strobe sub-circuit of the (n−1)-th stage control signal generating circuit, the second input terminal of the strobe sub-circuit being electrically connected to receive the k-th clock signal, and the output terminal of the strobe sub-circuit being electrically connected to first input terminals of at least two switching sub-circuits to provide the strobe signal;
    the at least two switching sub-circuits, each having a first input terminal and a second input terminal, the second input terminals of each of the at least two switching sub-circuits being electrically connected to receive different clock signals of the other K−1 clock signals;
    wherein the second input terminal of the strobe sub-circuit is also electrically connected to a second input terminal of a first switching sub-circuit of the at least two switching sub-circuits of the (n−1)-th stage control signal generating circuit, the first switching sub-circuit being a switching sub-circuit that outputs a control signal last of the at least two switching sub-circuits that sequentially output control signals.

3. The control signal generator according to claim 2, wherein when N is greater than or equal to 3, the first input terminal of the strobe sub-circuit of a first stage control signal generating circuit is electrically connected to the output terminal of the strobe sub-circuit of an N-th stage control signal generating circuit.

4. The control signal generator according to claim 2, wherein the strobe sub-circuit comprises a latch, a data input terminal of the latch is used as the first input terminal of the strobe sub-circuit, and a clock input terminal of the latch is used as the second input terminal of the strobe sub-circuit.

5. The control signal generator according to claim 2, wherein each of the at least two switching sub-circuits comprises:
 a transmission gate, a control terminal of the transmission gate being used as the first input terminal of the switching sub-circuit, and a data input terminal of the transmission gate being used as the second input terminal of the switching sub-circuit.

6. The control signal generator according to claim 1, wherein valid pulse edges of the K clock signals are sequentially different by 1/K clock signal period, and a duty cycle of each of the K clock signals is 1/K.

7. A driving method for the control signal generator according to claim 1, comprising:

applying K clock signals to the control signal generator; wherein
the n-th stage control signal generating circuit:
 generates the strobe signal of the n-th stage control signal generating circuit based on the k-th clock signal of the K clock signals and the strobe signal of the (n−1)-th stage control signal generating circuit; and
 sequentially outputs at least two different clock signals of the other K−1 clock signals as control signals based on the strobe signal of the n-th stage control signal generating circuit.

8. The driving method according to claim 7, wherein a valid pulse edge of the k-th clock signal is within a valid pulse duration of the strobe signal of the (n−1)-th stage control signal generating circuit.

9. The driving method according to claim 7, wherein in response to applying K clock signals whose valid pulse edges are different from each other by a set time to the control signal generator, an enable signal is also applied to a first stage control signal generating circuit, wherein a valid pulse edge of a clock signal based on which the first stage control signal generating circuit generates the strobe signal is within a valid pulse duration of the enable signal.

10. The driving method according to claim 7, wherein valid pulse edges of the K clock signals are sequentially different by 1/K clock signal period, and a duty cycle of each of the K clock signals is 1/K.

* * * * *